(12) United States Patent
Panigrahi

(10) Patent No.: US 9,369,033 B2
(45) Date of Patent: Jun. 14, 2016

(54) LOW POWER SWITCHED MODE POWER SUPPLY

(71) Applicant: QUALCOMM TECHNOLOGIES INTERNATIONAL, LTD., Cambridge (GB)

(72) Inventor: Sukanta Kishore Panigrahi, Cambridge (GB)

(73) Assignee: QUALCOMM TECHNOLOGIES INTERNATIONAL, LTD., Cambridge (GB)

(*) Notice: Subject to any disclaimer, the term of this patent is extended or adjusted under 35 U.S.C. 154(b) by 383 days.

(21) Appl. No.: 14/144,793

(22) Filed: Dec. 31, 2013

(65) Prior Publication Data

US 2015/0188402 A1 Jul. 2, 2015

Related U.S. Application Data

(63) Continuation-in-part of application No. 14/143,150, filed on Dec. 30, 2013.

(51) Int. Cl.
| | |
|---|---|
| *H02M 1/08* | (2006.01) |
| *H02M 3/156* | (2006.01) |
| *H02M 3/158* | (2006.01) |
| *H03K 17/12* | (2006.01) |
| *H02J 1/00* | (2006.01) |
| *H02M 1/00* | (2006.01) |

(52) U.S. Cl.
CPC .............. *H02M 1/08* (2013.01); *H02M 3/158* (2013.01); *H02M 3/1563* (2013.01); *H03K 17/122* (2013.01); *H02M 2001/009* (2013.01); *H02M 2001/0054* (2013.01); *H03K 2217/0081* (2013.01); *Y02B 70/1491* (2013.01); *Y10T 307/406* (2015.04)

(58) Field of Classification Search
CPC .......................................................... H02J 1/00
USPC ........................................................... 307/18
See application file for complete search history.

(56) References Cited

U.S. PATENT DOCUMENTS

| | | | |
|---|---|---|---|
| 5,861,735 | A | 1/1999 | Uchida |
| 2006/0221649 | A1 | 10/2006 | Yamanaka et al. |
| 2010/0225295 | A1 | 9/2010 | Kranz et al. |
| 2013/0214749 | A1 | 8/2013 | Huang et al. |
| 2015/0188407 | A1 | 7/2015 | Golder et al. |

OTHER PUBLICATIONS

GB Search Report issued in related GB Application No. 1414001.6, dated Feb. 9, 2015.

*Primary Examiner* — Robert Deberadinis
(74) *Attorney, Agent, or Firm* — Procopio, Cory, Hargreaves & Savitch, LLP

(57) ABSTRACT

A switched mode power supply for supplying power from a power source to one or more output voltage rails, including: a switching unit configured to receive a source voltage from the power source and to output a switched voltage, the switching unit including: a first switch configured to switch the source voltage to the switched voltage, and configured to be driven by the source voltage; and a second switch connected in parallel with the first switch, the second switch configured to switch the source voltage to the switched voltage, and configured to be driven by an output voltage of one of the output voltage rails.

18 Claims, 5 Drawing Sheets

LOW POWER SWITCHED MODE POWER SUPPLY

CROSS-REFERENCE TO RELATED APPLICATIONS

This application is a continuation-in-part application of co-pending U.S. patent application Ser. No. 14/143,150, filed Dec. 30, 2013, and entitled "Low Power Switched Mode Power Supply."

BACKGROUND

Integrated circuit chips use power supplies to convert an input voltage from a power source to an output voltage across an output load. Typically, such power supplies are regulated in order to maintain a constant output voltage across the output load even if the output load changes and/or the input voltage varies.

A switched mode power supply utilises a switching arrangement between the power source and the output load. This switching arrangement continually switches ON and OFF. In the ON state, the power source is connected to the output load. In the OFF state, the power source is not connected to the output load. The duty cycle (proportion of ON time) is selected in order to achieve the desired output voltage. Excess energy is stored in the circuit until it is released to the output load.

FIG. 1 illustrates a switched mode power supply. This switched mode power supply supplies current from a power source connected to $V_{SOURCE}$ to a plurality of output rails 102, 103, 104 and 105 in order to power output loads on those output rails. A switching arrangement controls the connection of the power source to the remainder of the power supply. This power supply is a single-inductor-multiple-output (SIMO) power supply. It uses inductor 106 to store energy when the power source is connected to the remainder of the power supply. The particular arrangement illustrated in FIG. 1 is a buck-boost converter. In the buck mode, the voltage output to an output rail is less than the source voltage $V_{SOURCE}$. In this mode, switch 109 remains open and switches 107 and 108 continually switch ON and OFF. In the boost mode, the voltage output to an output rail is greater than the source voltage $V_{SOURCE}$. In this mode, switch 107 remains closed, switch 108 remains open and switch 109 continually switches ON and OFF. In the buck-boost mode, the voltage output to an output rail may be greater or less than the source voltage $V_{SOURCE}$, and all three switches switch ON and OFF.

Switch 107 is typically a PMOS transistor. When the source voltage $V_{SOURCE}$ is sufficiently high, the PMOS transistor acts as a very efficient switch. However, if the gate source voltage of the PMOS transistor is close to a threshold voltage (~0.8V) then the transistor becomes very resistive. It does switch current from the power source through to the remainder of the power supply in this region, but much of that current is dissipated as heat. Thus, the efficiency of the power supply is degraded.

There is increasing market demand for lower power devices. Thus, there is a need for a switched mode power supply that operates more efficiently at low source voltages.

SUMMARY OF THE INVENTION

According to a first aspect of the disclosure, there is provided a switched mode power supply for supplying power from a power source to one or more output voltage rails, comprising: a switching unit configured to receive a source voltage from the power source and to output a switched voltage, the switching unit comprising: a first switch configured to switch the source voltage to the switched voltage, and configured to be driven by the source voltage; and a second switch connected in parallel with the first switch, the second switch configured to switch the source voltage to the switched voltage, and configured to be driven by an output voltage of one of the output voltage rails.

The first and second switches may be FETs. Suitably, one of the first and second switches is a PMOS transistor and the other of the first and second switches is an NMOS transistor. The first switch may be a PMOS transistor, and the second switch an NMOS transistor. Alternatively, the first switch may be an NMOS transistor, and the second switch a PMOS transistor.

The switching unit may further comprise: a first driver connected to the first switch, the first driver configured to convert the source voltage to a first drive voltage for driving the first switch; and a second driver connected to the second switch, the second driver configured to convert the output voltage to a second drive voltage for driving the second switch.

A switched mode power supply may further comprise a controller configured to control the first driver and the second driver to drive the first and second switches such that both switches switch the source voltage to the switched voltage contemporaneously.

According to a second aspect, there is provided a method of operating a switched mode power supply for supplying power from a power source to one or more output voltage rails, the switched mode power supply comprising a switching unit that receives a source voltage from the power source and outputs a switched voltage, the switching unit comprising a first switch and a second switch connected in parallel, the method comprising: driving the first switch by the source voltage to switch the source voltage to the switched voltage; and driving the second switch by an output voltage of one of the output voltage rails to switch the source voltage to the switched voltage.

The switching unit may comprise a first driver connected to the first switch and a second driver connected to the second switch, and the method may comprise: driving the first switch by, at the first driver, converting the source voltage to a first drive voltage for driving the first switch; and driving the second switch by, at the second driver, converting the output voltage to a second drive voltage for driving the second switch.

The method may comprise controlling the first driver and the second driver to drive the first and second switches such that both switches switch the source voltage to the switched voltage contemporaneously.

Suitably, the output voltage is higher than the source voltage.

Suitably, the first switch is a FET and the output voltage is higher than the combination of the source voltage and a gate-source threshold voltage of the FET.

The method may comprise only driving the second switch by the output voltage to switch the source voltage to the switched voltage if the source voltage is less than a threshold voltage.

The threshold voltage may be a gate-source threshold voltage of the FET.

The switched mode power supply may operate in a first mode when the source voltage is below a threshold voltage and in a second mode when the source voltage is above the threshold voltage.

Suitably, in the first mode, the method comprises driving the second switch by converting the output voltage to a second drive voltage for driving the second switch.

Suitably, in the second mode, the method comprises disabling the driving of the second switch. The driving of the second switch may be disabled by disabling the supply of current to the output voltage rail having the output voltage.

BRIEF DESCRIPTION OF THE FIGURES

This disclosure will now be described by way of example with reference to the accompanying figures. In the figures.

DETAILED DESCRIPTION

The following description is presented by way of example to enable any person skilled in the art to make and use the invention. The present invention is not limited to the examples described herein and various modifications to the disclosed examples will be readily apparent to those skilled in the art.

FIGS. 2, 3, 4 and 5 are schematic diagrams of exemplary switched mode power supply circuitry. These figures present components of this circuitry in terms of functional blocks. Some functional blocks for carrying out functions well known in the art have in places been omitted from these figures.

Figure 2:
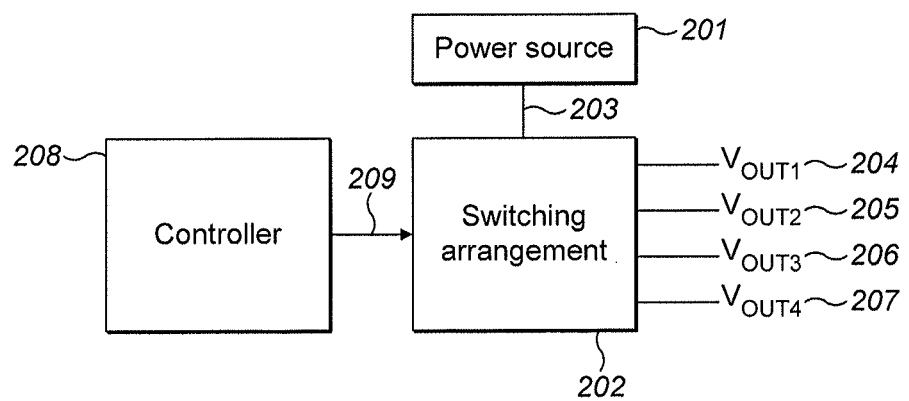
FIG. 2 illustrates an exemplary switched mode power supply.

FIG. 2 illustrates the general structure of an exemplary switched mode power supply. Power source 201 is connected to switching arrangement 202 by source voltage rail 203. Power source 201 may be, for example, a battery source. Switching arrangement 202 is connected to output voltage rails 204, 205, 206 and 207. Controller 208 provides a control signal 209 to switching arrangement 202. Output voltage rails 204, 205, 206 and 207 provide output voltages to further circuitry not shown on FIG. 2. Four output voltage rails have been shown for illustration purposes only. The switching arrangement 202 may be connected to fewer or greater than four output voltage rails. The switching arrangement 202 may be connected to a single output voltage rail, or to a plurality of output voltage rails. The switching arrangement 202 connects the source voltage rail 203 to the output voltage rails, thereby enabling a source voltage on source voltage rail 203 to be converted to output voltages $V_{OUT1}$, $V_{OUT2}$, $V_{OUT3}$ and $V_{OUT4}$ on output voltage rails 204, 205, 206 and 207 respectively. Suitably, controller 208 controls the switching arrangement 202 to switch the source voltage on source voltage rail 203 through to an output voltage rail.

Figure 3:
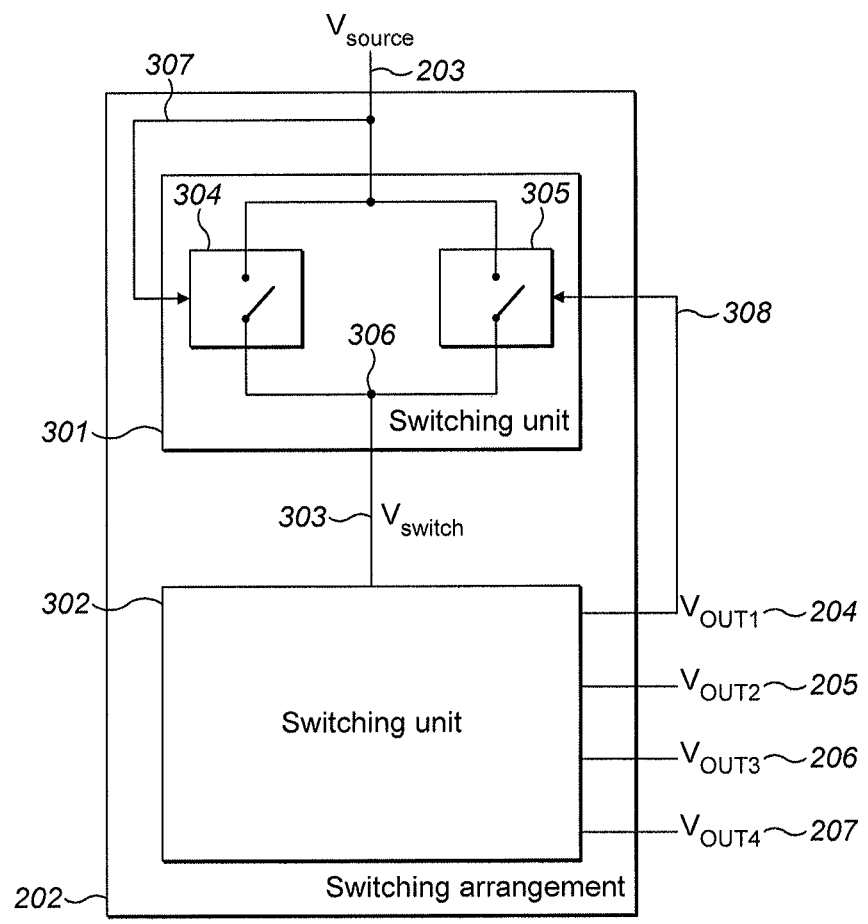
FIG. 3 illustrates an arrangement of the switching arrangement of FIG. 2.

FIG. 3 illustrates an exemplary arrangement of the switching arrangement 202 of FIG. 2. Switching arrangement 202 comprises two switching units: switching unit 301 and switching unit 302. Switching unit 301 receives as an input the source voltage $V_{SOURCE}$ on source voltage rail 203. Switching unit 301 outputs switched voltage $V_{SWITCH}$ 303. Switching unit 301 comprises two switches: switch 304 and switch 305. Suitably, switching unit 301 comprises no more switches than these two switches 304 an 305. Switches 304 and 305 both receive source voltage $V_{SOURCE}$ as an input. Switches 304 and 305 are connected in parallel. The output of switch 304 and the output of switch 305 connect at node 306 to form the signal output from the switching unit 301 having switched voltage $V_{SWITCH}$. Switch 304 is driven by the source voltage $V_{SOURCE}$ on line 307. Switch 305 is driven by an output voltage of one of the output voltage rails. In the example of FIG. 3, switch 305 is driven by $V_{OUT1}$ on line 308. The output 303 of switching unit 301 is input to switching unit 302. Switching unit 302 is connected to output voltage rails 204, 205, 206 and 207.

In operation, switching unit 301 receives a source voltage $V_{SOURCE}$ from the power source 201. Control signal 307 controls switch 304 to connect the source voltage signal 203 through to switch 304's output. Control signal 308 controls switch 305 to connect the source voltage signal 203 through to switch 305's output. Switching unit 302 switches the switched voltage signal $V_{SWITCH}$ through to a selected one of the output voltage rails 204, 205, 206, 207.

Figure 4:
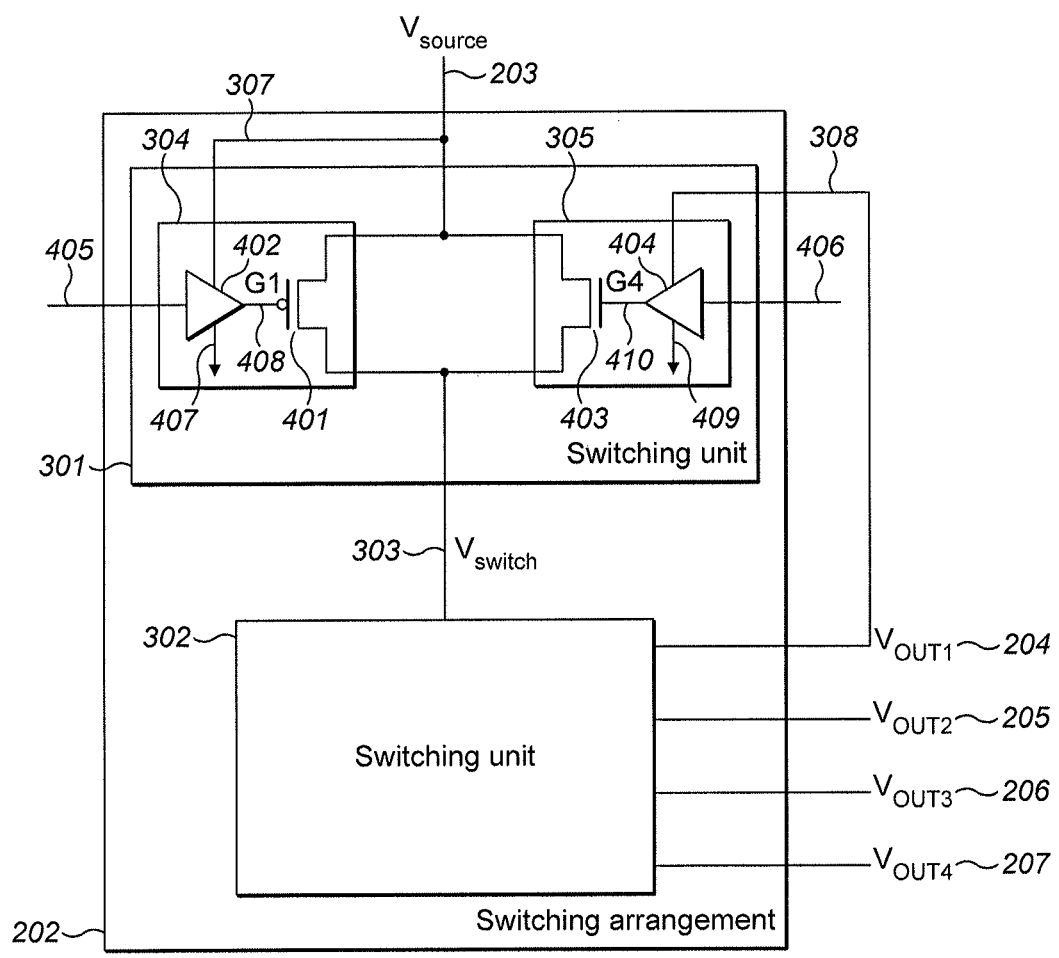
FIG. 4 illustrates a further arrangement of the switching arrangement of FIG. 2.

FIG. 4 illustrates an exemplary arrangement of the switching unit 301 of FIG. 3. Switch 304 comprises a field effect transistor (FET) switch 401 and a driver 402. Switch 305 also comprises a field effect transistor (FET) switch 403 and a driver 404. In the arrangement depicted in FIG. 4, FET switch 401 is a PMOS transistor and FET switch 403 is an NMOS transistor. In an alternative arrangement, FET switch 401 is an NMOS transistor and FET switch 403 is a PMOS transistor. Driver 402 receives two inputs: the control signal 307 which is the source voltage signal, and a control signal 405. Suitably, control signal 405 is received from controller 208 as part of control line 209 of FIG. 2. Driver 402 is coupled to ground 407. Driver 402 outputs a drive voltage signal on line 408 which is input to the gate of FET switch 401. Driver 404 receives two inputs: the control signal 308 which is the output voltage signal $V_{OUT1}$, and a control signal 406. Suitably, control signal 406 is received from controller 208 as part of control line 209 of FIG. 2. Driver 404 is coupled to ground 409. Driver 404 outputs a drive voltage signal on line 410 which is input to the gate of FET switch 403.

Driver 402 converts the source voltage to a drive voltage for FET switch 401 under the control of the control signal 405. If the control signal 405 indicates to the driver 402 that the FET switch 401 is to be closed, then the driver 402 responds by converting the source voltage to a drive voltage to drive the gate of FET switch 401. If the control signal 405 indicates to the driver 402 that the FET switch 401 is to be open, then the driver responds by not outputting a drive voltage to the gate of FET switch 401.

Driver 404 converts the output voltage $V_{OUT1}$ to a drive voltage for FET switch 404 under the control of the control signal 406. If the control signal 406 indicates to the driver 404 that the FET switch 403 is to be closed, then the driver 404 responds by converting the output voltage $V_{OUT1}$ to a drive voltage to drive the gate of FET switch 404. If the control signal 406 indicates to the driver 404 that the FET switch 403 is to be open, then the driver responds by not outputting a drive voltage to the gate of FET switch 403.

Suitably, controller 208 provides control signals 405 and 406 which cause both FET switches 401 and 403 to switch the source voltage through to their respective outputs contemporaneously. The drive signal 408 to FET switch 401 is biased in a complementary manner to the drive signal 410 to FET switch 403. This is illustrated on FIGS. 6 and 7, which illustrate the drive signal G1 at the gate of the FET switch 401 and the drive signal G4 at the gate of the FET switch 403. The drive signals G1 and G4 are complementary, i.e. when G1 is HIGH, G4 is LOW and vice versa. PMOS and NMOS transistors have complementary behaviour. Thus, since one of the FET switches is a PMOS transistor and the other FET switch is an NMOS transistor, this means that both FET switches switch the source voltage through to their respective outputs contemporaneously.

Figure 5:
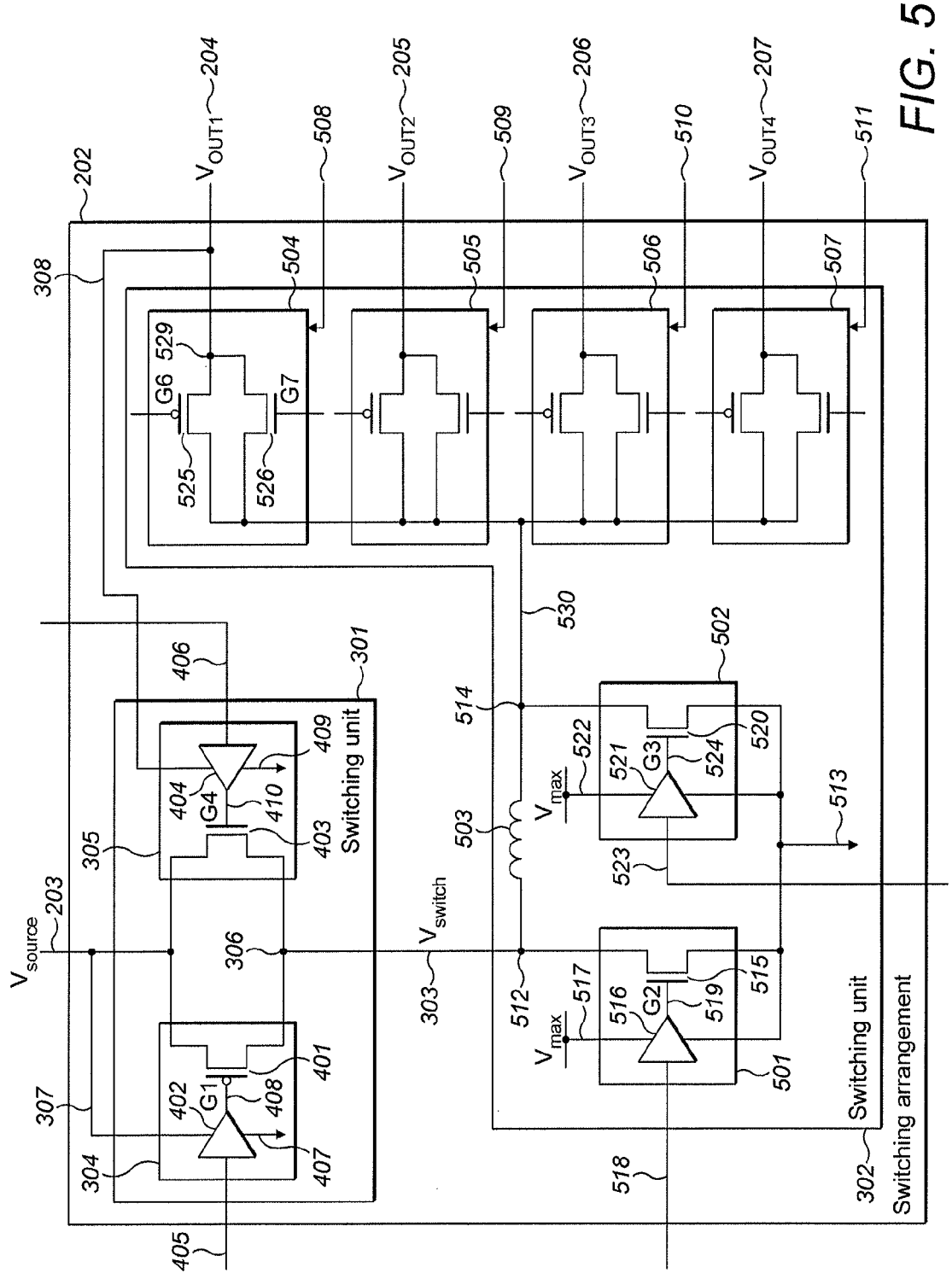
FIG. 5 illustrates a further arrangement of the switching arrangement of FIG. 2.

FIG. 5 illustrates the switching unit 301 of FIG. 4 in addition to an exemplary arrangement of the switching unit 302 of the switched mode power supply. FIG. 5 illustrates the switching configuration for a Single Inductor Multiple Output (SIMO) switched mode power supply.

Switching unit 302 comprises an inductor 503 and switches 501, 502, 504, 505, 506 and 507. Switches 501 and 502 are voltage regulation switches, as will be explained in the following. Switches 504, 505, 506 and 507 are output switches.

Switch 501 is connected to the input to the switching unit 302 at node 512. Switch 501 couples the node 512 to ground 513. Switch 501 comprises a FET switch 515 and a driver 516. In the arrangement depicted in FIG. 5, FET switch 515 is an NMOS transistor. Driver 516 receives two inputs: a voltage signal 517 $V_{MAX}$ and control signal 518. Suitably, control signal 518 is received from controller 208 as part of control line 209 of FIG. 2. Driver 516 outputs a drive voltage signal G2 on line 519 which is input to the gate of FET switch 515. $V_{MAX}$ is the highest of all of the set of voltages including the source voltage and the output voltages on the output voltage rails. In other words:

$$V_{MAX}=\max(V_{SOURCE},V_{OUT1},V_{OUT2},V_{OUT3},V_{OUT4})$$ (equation 1)

Inductor 503 is connected to the input to the switching unit 302 at node 512. Inductor 503 is connected at one end to the input to switch 501 and at the other end to the input to switch 502. The inductor 503 stores energy when the switching unit 301 outputs a signal voltage $V_{SWITCH}$.

Switch 502 is connected to node 514 which is connected to the other side of the inductor 503 than node 512. Switch 502 couples node 514 to ground 513. Switch 502 comprises a FET switch 520 and a driver 521. In the arrangement depicted in FIG. 5, FET switch 520 is an NMOS transistor. Driver 521 receives two inputs: a voltage signal 522 $V_{MAX}$ and control signal 523. Suitably, control signal 523 is received from controller 208 as part of control line 209 of FIG. 2. Driver 521 outputs a drive voltage signal G3 on line 524 which is input to the gate of FET switch 520.

Switches 501 and 502, along with inductor 503 and switching unit 301 operate to convert the source voltage $V_{SOURCE}$ to a desired output voltage at output 530.

Output switches 504, 505, 506 and 507 are all connected to output 530. The output of switch 504 is the output voltage rail 204. The output of switch 505 is the output voltage rail 205. The output of switch 506 is the output voltage rail 206. The output of switch 507 is the output voltage rail 207. Each output voltage rail has its own associated switch. Four output switches 504, 505, 506 and 507 are shown in FIG. 5 because FIG. 5 depicts four output voltage rails. In an example with fewer output voltage rails there would be fewer output switches. In an example with more output voltage rails there would be more output switches. Suitably, each output switch comprises two FET switches connected in parallel. Suitably, each output switch comprises a PMOS transistor and an NMOS transistor connected in parallel. For example, output switch 504 comprises PMOS transistor 525 and NMOS transistor 526 connected in parallel. Both transistors 525 and 526 receive the same input. This input is the output 530 of the voltage regulation section of the switched mode power supply. The outputs of each of the FET switches 525 and 526 combine at node 529 to form the output for the output voltage rail, $V_{OUT1}$. The gate of the PMOS transistor 525 is driven by a drive signal G6. The gate of the NMOS transistor 526 is driven by a drive signal G7. Suitably, these drive signals G6 and G7 are controlled by control signal(s) 508 from controller 208. The other output switches 505, 506 and 507 have a corresponding form and operation to that described with respect to output switch 504.

Switches 504, 505, 506 and 507 connect the voltage output from the voltage regulation switches on line 530 through to the selected output voltage rail 204, 205, 206 or 207 under the control of control signals 508, 509, 510 and 511 provided by controller 208.

The switched mode power supply switching arrangement illustrated in FIG. 5 is operable in a buck mode and in a buck-boost mode.

Figure 6:
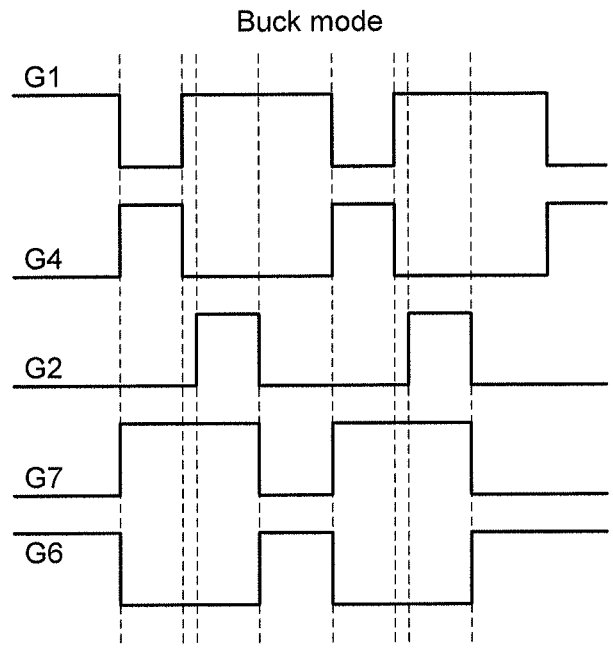
FIG. 6 illustrates the gate signals of the switching arrangement in a buck mode.

In a buck mode, the voltage output to an output voltage rail is less than the source voltage $V_{SOURCE}$. FIG. 6 illustrates the gate signal waveforms in the buck mode of operation. Gate signal G3 is not depicted on FIG. 6 because switch 502 remains open during the buck mode. Switches 304, 305 and 501 continually switch ON and OFF in order to convert the source voltage $V_{SOURCE}$ to an output voltage to be output on one of the output voltage rails. The gate signal G1 to FET switch 401 and the gate signal G4 to FET switch 403 are complementary as already described. The switching unit 301 as a whole passes current from its input to its output when G1 is LOW and G4 is HIGH.

The gate signal G2 to FET switch 515 has the same form as the gate signal G4 to FET switch 403, but lags G4 such that G2 goes HIGH just after G4 has transitioned to LOW. So the switching unit 301 and switch 501 do not pass current at the same time. The time gap in between G4 transitioning to LOW and G2 transitioning to HIGH ensures that there is no overlapping time period during which the switching unit 301 and the switch 501 are both passing current (which would be driven straight to ground 513).

Each output switch comprises a PMOS transistor and an NMOS transistor connected in parallel. FIG. 6 illustrates the gate signal G7 to the NMOS transistor and the gate signal G6 to the PMOS transistor of output switch 504 for the case that the output of the voltage regulation switches 530 is output to the output voltage rail 204. If the output of the voltage regulation switches 530 was instead output to a different output voltage rail, then the gates of the output switch associated with that output voltage rail would be driven as described with respect to output switch 504. PMOS transistor 525 and NMOS transistor 526 are driven in a complementary manner. Thus, the drive signals G6 and G7 are complementary, i.e. when G6 is HIGH, G7 is LOW and vice versa. PMOS and NMOS transistors have complementary behaviour, thus both transistors switch the output voltage through to their respective outputs contemporaneously. The output switch 504 as a whole passes current from its input to its output when G6 is LOW and G7 is HIGH. Thus, from inspection of FIG. 6, it can be seen that the output switch is driven to pass current through to the output voltage rail during the time period when either the switching unit 301 or the switch 501 is passing current through to its respective output.

Figure 7:
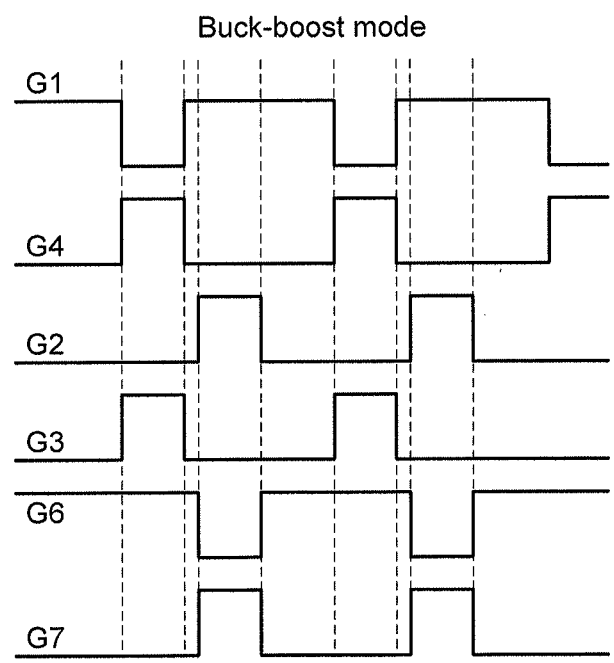
FIG. 7 illustrates the gate signals of the switching arrangement in a buck-boost mode.

In a buck-boost mode, the voltage output to an output voltage rail may be greater than, the same, or less than the source voltage $V_{SOURCE}$. FIG. 7 illustrates the gate signal waveforms in the buck-boost mode of operation. Switches 304, 305, 501 and 502 continually switch ON and OFF in order to convert the source voltage $V_{SOURCE}$ to an output voltage to be output on one of the output voltage rails.

The gate signals G1, G4 and G2 all operate as described with respect to FIG. 6. The gate signal G3 to FET switch 520 has the same form as the gate signal G4 to FET switch 403, and is synchronised with the gate signal G4. In other words, G3 and G4 transition to HIGH and LOW at the same time.

The gate signals G6 and G7 to the output switch are complementary as described with respect to FIG. 6. The output switch 504 as a whole passes current from its input to its output when G6 is LOW and G7 is HIGH. Thus, from inspection of FIG. 7, it can be seen that the output switch is driven to pass current through to the output voltage rail during the time period when the switch 501 is passing current to its output. In other words the output switch is driven to pass current through to the output voltage rail when G2 is HIGH.

FIG. 5 illustrates a particular exemplary arrangement of PMOS and NMOS FET switches. In other examples, a different arrangement of FET switches and driving signals may be used. For example, FET switch 515 may be a PMOS switch that is driven with a complimentary gate signal to G2. As another example, FET switch 520 may be a PMOS switch that is driven with a complimentary gate signal to G3.

Suitably, the switched mode power supply compares the output voltage on an output voltage rail $V_{OUT1}$ to the source voltage $V_{SOURCE}$ prior to charging the output voltage rail. If the source voltage is greater than the output voltage $V_{SOURCE} > V_{OUT1}$, then the switched mode power supply is controlled by controller 208 to operate in a buck mode to supply current to the output voltage rail. If the source voltage is the same or less than the output voltage $V_{SOURCE} \leq V_{OUT1}$, then the switched mode power supply is controlled by controller 208 to operate in a buck-boost mode to supply current to the output voltage rail.

Suitably, current is supplied to only one output voltage rail at a time. This avoids cross conduction between the output voltage rails. The output voltage rails are not all necessarily connected to the switched mode power supply at all times. An output voltage rail may be disconnected from the switching arrangement 202.

Figure 1:
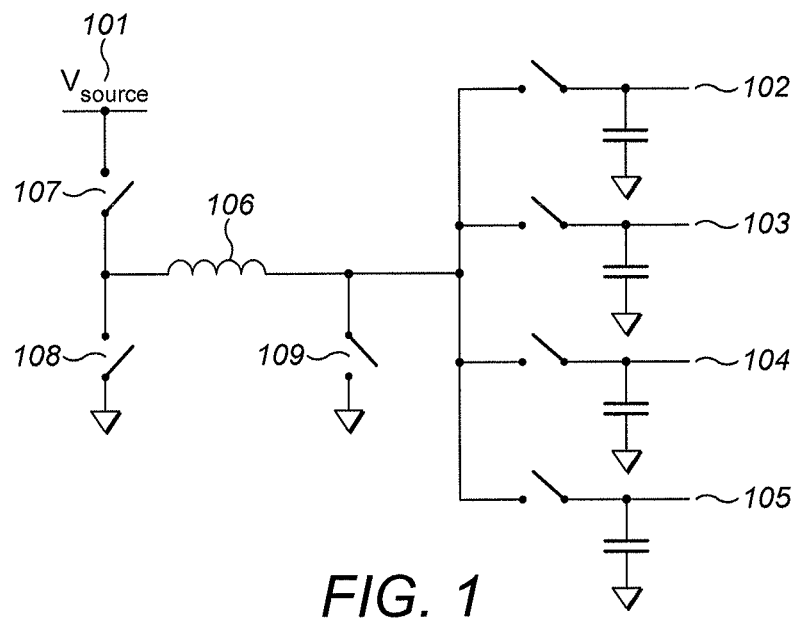
FIG. 1 illustrates a buck-boost switched mode power supply.

As described above, the efficiency of the switched mode power supply of FIG. 1 drops significantly for very low source voltages $V_{SOURCE}$, for example ~0.8V. This is because the driving voltage applied to the PMOS switch 107 is very low and hence the gate source voltage of the PMOS switch is very low. Thus, although the PMOS switch is operational, it is very resistive.

In the switched mode power supply arrangements described herein, the PMOS switch 401 suffers from the same problem as the switch 107 of FIG. 1 because PMOS switch 401 is driven by the source voltage $V_{SOURCE}$ on line 307. However, the efficiency of the switched mode power supply is not degraded, as will now be explained.

In its ON condition, FET switch 403 passes the voltage $V_{SOURCE}$ to its output to node 306. FET switch 403 is driven by driver 404. The supply to driver 404 is from an output voltage $V_{OUT1}$ of an output voltage rail of the switched mode power supply. Suitably, this output voltage $V_{OUT1}$ is greater than the combination of $V_{SOURCE}$ and the gate voltage at which a FET switch becomes very resistive. In other words, suitably $V_{OUT1} > V_{SOURCE} + V_{GS}$, where $V_{GS}$ is the gate-source threshold voltage of the FET switch. The gate-source threshold voltage of the FET switch is the voltage at which the FET switch starts to become very resistive. Preferably, $V_{OUT1}$ is greater than 1.5V. Suitably, $V_{OUT1}$ is a steady state voltage. Thus, FET switch 403 is always driven by a voltage which is greater than the combination of $V_{SOURCE}$ and the gate-source threshold voltage of the FET switch 403. This is the case even if the source voltage $V_{SOURCE}$ has dropped to or below the gate-source threshold voltage of the FET switch. Thus, FET switch 403 does not become very resistive when the source voltage $V_{SOURCE}$ drops to or below the gate-source threshold voltage. FET switch 403 is placed in parallel with FET switch 401. Both FET switches 401 and 403 convert the source voltage to an output. When the source voltage is very low, for example below ~0.8V, FET switch 401 becomes very resistive, but FET switch 403 does not become resistive. Thus, when the source voltage is very low, FET switch 403 continues to switch the source voltage signal through to its output. Thus, by placing FET switch 403 in parallel with FET switch 401, a lower impedance path through the switching unit 301 is available at low source voltages compared to just using one FET switch driven by the source voltage. Thus, the efficiency of the switched mode power supply at low source voltages is increased.

At higher source voltages, the gate source voltage of the FET switch 401 is high enough that the FET switch 401 provides a low impedance path through the switching unit. Thus at higher source voltages, the FET switch 401 acts as a very efficient switch. Thus, the additional FET switch 403 is not necessary at higher source voltages. In one example, the switched mode power supply is operable in two modes. The source voltage is compared to a threshold voltage. If the source voltage is higher than the threshold voltage, then the switched mode power supply operates in a first mode. If the source voltage is lower than or the same as the threshold voltage, then the switched mode power supply operates in a second mode.

In the first mode, the FET switch 403 is not operated to pass current from its input to its output. Suitably, the driver 404 is disabled from providing a drive signal to the FET switch 403. The driver 404 may be disabled from providing a drive signal to the FET switch 403 by a control signal from controller 208 on control line 406. Alternatively, the driver 404 may be disabled from providing a drive signal to the FET switch 403 by disabling the supply of current to the output voltage rail which provides the output voltage $V_{OUT1}$. For example the output voltage rail 204 may be disconnected from the switching arrangement 202. Suitably, this is under the control of controller 208 on control line 508.

In the second mode, the FET switch 403 is operated to pass current from its input to its output, which is driven by driver 404. The voltage input to driver 404 is provided by the output voltage $V_{OUT1}$ on the output voltage rail 204. Controller 208 controls the FET switch 403 via control line 406 and control line 508 to output switch 504 as previously described.

Thus, the FET switch 403 is only operable to pass current through from its input to its output when the source voltage is lower or the same as a threshold value. Suitably, the threshold value is 1.5V. This threshold value may be configurable. For example, the threshold value may be configured in dependence on the on resistance ($R_{ON}$) of the FET switch 403.

The switched mode power supply described herein operates more efficiently at low source voltages without the need for additional circuitry external to the switched mode power supply, for example a separate boost circuit or a negative charge pump.

The described switched mode power supply circuitry is suitably incorporated within a computing-based device. The computing-based device may be an electronic device. Suitably, the computing-based device comprises one or more processors for processing computer executable instructions to control operation of controller 208 to control implementation of the methods described herein. The computer executable instructions can be provided using any computer-readable media such as a memory. Further software can be provided at the computing-based device to implement the methods described herein. The methods described herein may be performed by software in machine readable form on a tangible storage medium.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A switched mode power supply for supplying power from a power source to one or more output voltage rails, comprising:
    a switching unit configured to receive a source voltage from the power source and to output a switched voltage, the switching unit comprising:
    a first switch configured to switch the source voltage to the switched voltage, and configured to be driven by the source voltage; and
    a second switch connected in parallel with the first switch, the second switch configured to switch the source voltage to the switched voltage, and configured to be driven by an output voltage of one of the output voltage rails.

2. A switched mode power supply as claimed in claim 1, wherein the first and second switches are FETs.

3. A switched mode power supply as claimed in claim 2, wherein one of the first and second switches is a PMOS transistor and the other of the first and second switches is an NMOS transistor.

4. A switched mode power supply as claimed in claim 3, wherein the first switch is a PMOS transistor, and the second switch is an NMOS transistor.

5. A switched mode power supply as claimed in claim 3, wherein the first switch is an NMOS transistor, and the second switch is a PMOS transistor.

6. A switched mode power supply as claimed in claim 1, wherein the switching unit further comprises:
    a first driver connected to the first switch, the first driver configured to convert the source voltage to a first drive voltage for driving the first switch; and
    a second driver connected to the second switch, the second driver configured to convert the output voltage to a second drive voltage for driving the second switch.

7. A switched mode power supply as claimed in claim 6, further comprising a controller configured to control the first driver and the second driver to drive the first and second switches such that both switches switch the source voltage to the switched voltage contemporaneously.

8. A method of operating a switched mode power supply for supplying power from a power source to one or more output voltage rails, the switched mode power supply comprising a switching unit that receives a source voltage from the power source and outputs a switched voltage, the switching unit comprising a first switch and a second switch connected in parallel, the method comprising:
    driving the first switch by the source voltage to switch the source voltage to the switched voltage; and
    driving the second switch by an output voltage of one of the output voltage rails to switch the source voltage to the switched voltage.

9. A method as claimed in claim 8, wherein the switching unit comprises a first driver connected to the first switch and a second driver connected to the second switch, the method comprising:
    driving the first switch by, at the first driver, converting the source voltage to a first drive voltage for driving the first switch; and
    driving the second switch by, at the second driver, converting the output voltage to a second drive voltage for driving the second switch.

10. A method as claimed in claim 9, further comprising controlling the first driver and the second driver to drive the first and second switches such that both switches switch the source voltage to the switched voltage contemporaneously.

11. A method as claimed in claim 8, wherein the output voltage is higher than the source voltage.

12. A method as claimed in claim 8, wherein the first switch is a FET and the output voltage is higher than the combination of the source voltage and a gate-source threshold voltage of the FET.

13. A method as claimed in claim 8, comprising only driving the second switch by the output voltage to switch the source voltage to the switched voltage if the source voltage is less than a threshold voltage.

14. A method as claimed in claim 13, wherein the first switch is a FET and the threshold voltage is a gate-source threshold voltage of the FET.

15. A method as claimed in claim 8, wherein the switched mode power supply operates in a first mode when the source voltage is below a threshold voltage and operates in a second mode when the source voltage is above the threshold voltage.

16. A method as claimed in claim 15, wherein in the first mode, the method comprises driving the second switch by converting the output voltage to a second drive voltage for driving the second switch.

17. A method as claimed in claim 15, wherein in the second mode, the method comprises disabling the driving of the second switch.

18. A method as claimed in claim 17, wherein the driving of the second switch is disabled by disabling the supply of current to the output voltage rail having the output voltage.

* * * * *